United States Patent [19]

Tran

[11] Patent Number: 5,418,821

[45] Date of Patent: * May 23, 1995

[54] METHOD AND APPARATUS FOR SAMPLE-DATA RECEIVER SQUELCH

[75] Inventor: Toan V. Tran, San Jose, Calif.

[73] Assignee: National Semiconductor Corporation, Santa Clara, Calif.

[*] Notice: The portion of the term of this patent subsequent to Feb. 8, 2011 has been disclaimed.

[21] Appl. No.: 905,757

[22] Filed: Jun. 29, 1992

Related U.S. Application Data

[63] Continuation-in-part of Ser. No. 775,741, Oct. 15, 1991, Pat. No. 5,285,481.

[51] Int. Cl.⁶ .................................................. H04B 1/10
[52] U.S. Cl. .................................. 375/351; 375/350; 455/213; 327/31; 327/172
[58] Field of Search .................. 375/104, 103, 5, 17, 375/22; 455/218, 219, 220, 221, 222, 223; 307/234, 265, 268, 518; 328/108, 110, 112, 115

[56] References Cited

U.S. PATENT DOCUMENTS

| | | | |
|---|---|---|---|
| 3,753,135 | 8/1973 | Kastner et al. | 329/106 |
| 3,979,679 | 9/1976 | Bush et al. | 455/218 |
| 4,078,204 | 3/1978 | Gauthier | 328/21 |
| 4,414,689 | 11/1983 | Enderson | 455/221 |
| 4,724,545 | 2/1988 | Hamada | 455/218 |
| 4,908,530 | 3/1990 | Huang | 375/104 |
| 4,926,072 | 5/1990 | Hyodo | 307/542.1 |
| 5,199,049 | 3/1993 | Wilson | 375/104 |
| 5,285,481 | 2/1994 | Van Tran | 375/17 |

FOREIGN PATENT DOCUMENTS 0166380  1/1986  European Pat. Off. ...... G01R 23/15

OTHER PUBLICATIONS

Glenn O'Dell, "Digital One-Shot", Electronic Engineering, vol. 60, No. 740, Aug. 1988, p. 20.

Andrzej M. Cisek, "Logic-Gate Filter Handles Digital Signals", Electronics, vol. 54, No. 6, Mar. 24, 1981, pp. 137-139.

V. L. Patil and R. Verma, "Pulse-Width Sieve Counts the Good and Bad", EDN Electrical Design News, vol. 25, No. 14, Aug. 1980, p. 130.

Primary Examiner—Stephen Chin
Assistant Examiner—Amanda T. Le
Attorney, Agent, or Firm—Limbach & Limbach; H. Donald Nelson; Vincenzo D. Pitruzzella

[57] ABSTRACT

A receiver circuit relies on sample data techniques to filter input data signals having a frequency less than a preselected maximum and greater than a preselected minimum. The circuit also rejects a single sine wave cycle. If an input pulse greater than a preselected maximum termination pulse width is encountered during data reception, then reception activity is terminated.

5 Claims, 1 Drawing Sheet

METHOD AND APPARATUS FOR SAMPLE-DATA RECEIVER SQUELCH

RELATED APPLICATION

The present application is a continuation-in-part of pending U.S. application Ser. No. 07/775,741 U.S. Pat. No. 5,285,481 filed by Toan Van Tran, the inventor in the present application, on Oct. 15, 1991, for RECEIVER CIRCUIT WITH SMART SQUELCH. application Ser. No. 07/775,741, which is commonly-assigned with the present application, is hereby incorporated by reference to provide additional background information regarding the present invention.

BACKGROUND OF THE INVENTION

1. Field of the Invention

The present invention relates to integrated circuits utilizable for recovering incoming digital data and, in particular, to a receiver squelch circuit that utilizes sample data techniques for pulse-width filtering.

2. Discussion of the Prior Art

The IEEE 802.3 standard for 10BASE-T Ethernet networks specifies a receiver filtering requirement for incoming data signals. According to the standard, the receiver must reject all signals that are not within the 2-15 MHz frequency range as well as all sine waves of single cycle duration. In addition, the receiver must be capable of recognizing the 250 ns Ethernet active-to-idle transition pulse as an End-of-Packet (EOP) symbol, thereby terminating reception.

Conventional bandpass filters are not suitable for 10BASE-T receiver applications because they do not reject single cycle data nor are they sensitive to the EOP pulse. In addition, bandpass filters are not amplitude-sensitive.

Therefore, it is necessary that a new receiver circuit be provided to meet 802.3 10BASE-T Ethernet requirements.

U.S. Pat. No. 5,285,481, referenced above, discloses a receiver circuit that utilizes analog pulse width timer-/integrators to filter data signals having a frequency less than a preselected maximum and greater than a preselected minimum. The circuit also rejects a single sine wave cycle. If an input pulse greater than a preselected maximum pulse width, e.g. the 10BASE-T EOP pulse width, is encountered during data reception, then reception activity is terminated.

While the receiver squelch circuit disclosed in the U.S. Pat. No. 5,285,481 provides a simple, yet elegant solution for meeting the 10BASE-T receiver filter requirement, it is a full analog solution, which although utilizable in CMOS/BiCMOS receivers, would be much simpler to incorporate in such receivers if implemented in CMOS.

It would, therefore, be highly desireable to have available a CMOS implementation that meets the IEEE 802.3 10BASE-T Ethernet receiver filter standard.

SUMMARY OF THE INVENTION

The present invention provides a receiver squelch circuit that utilizes sample data techniques for filtering an incoming differential data signal. The receiver squelch circuit includes a comparator that responds to the differential inputs by generating a positive pulse when the difference in signal level between the differential inputs exceeds a preselected threshold level and by generating a negative pulse when the difference in signal level is less than the preselected threshold level. A first sample data counter generates an active output signal when a positive pulse has a pulse width greater than the preselected minimum pulse width. A second sample data counter generates an active output signal when a negative pulse has a pulse width greater than the preselected minimum pulse width. A first maximum pulse width sample data counter monitors the first received pulse having a pulse width greater than the preselected minimum pulse width to determine whether that pulse has a pulse width less than a preselected maximum pulse width. A second maximum pulse width sample data counter determines whether a second received pulse, of polarity opposite to that of the first received pulse, has a pulse width less than the preselected maximum pulse width. Trigger logic responds to the first received pulse and to a third received pulse of the same polarity as the first received pulse by generating a receive data output signal that enables data reception. A reset sample data counter responds to a pulse having a pulse width greater than a preselected maximum termination pulse width by generating a reset signal that resets the counters and cancels the receive data output signal.

A better understanding of the features and advantages of the present invention will be obtained by reference to the following detailed description and accompanying drawings which set forth an illustrative embodiment in which the principles of the invention are utilized.

DETAILED DESCRIPTION OF THE INVENTION

Figure 1:
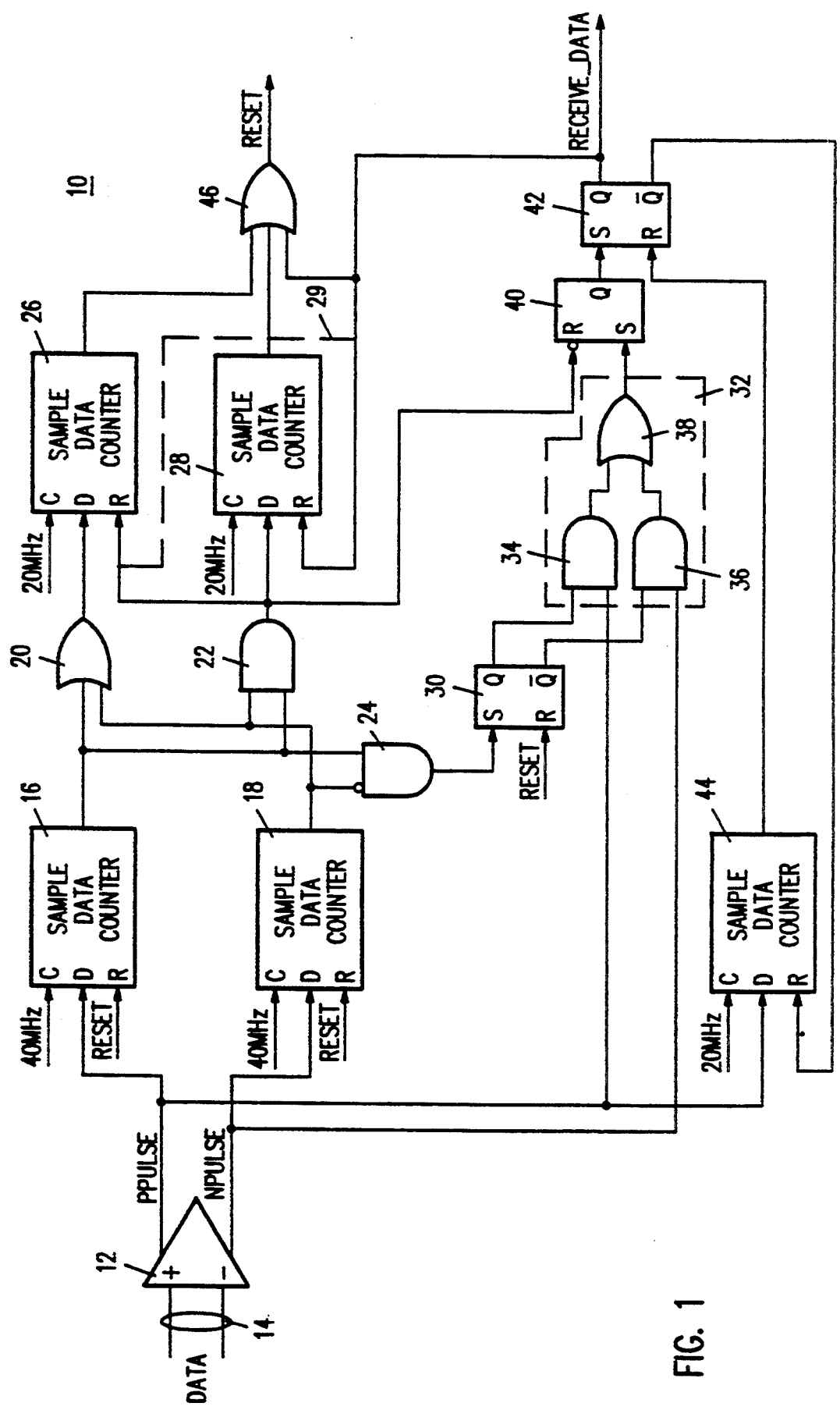
FIG. 1 is a logic diagram illustrating an embodiment of a sample data receiver squelch circuit in accordance with the present invention.

Although the present invention is described below with reference to specific requirements of the 10BASE-T Ethernet standard, it should be evident to one skilled in the art that these requirements are merely for illustrative purposes and are not intended to limit the scope or application of the invention.

FIG. 1 shows a receiver circuit 10 that forms a bandpass filter based on four sample data counters 16, 18, 26 and 28. The illustrated circuit 10 filters out signals that are not within a defined frequency range (less than a minimum frequency of 2.5 MHz and more than a maximum frequency of 15 MHz). The circuit 10 accepts data only if it is at least 1.5 cycles long. If an End-of-Packet (EOP) pulse greater than a selected maximum pulse width (e.g., 200 ns in the FIG. 1 embodiment) is encountered, then reception activity is terminated.

Receiver circuit 10 includes an input comparator 12 that receives an incoming differential data signal from the two lines of a twisted pair cable 14 at its non-inverting (+) and inverting (−) inputs. If the difference in signal level between the differential inputs of comparator 12 exceeds its positive threshold, then comparator 12 provides a positive output pulse PPULSE to a positive pulse sample data counter 16. If the difference in signal level between the differential inputs is less than the negative threshold of comparator 12, then comparator 12 provides a negative output pulse NPULSE to a negative pulse sample data counter 18.

Counter 16 and counter 18 are conventional sample data counters that are driven by a 40 MHz clock (25 ns period). Counters 16 and 18 monitor positive output pulse PPULSE and negative output-pulse NPULSE, respectively, to determine whether the pulse width of the output pulses PPULSE and NPULSE are longer than the 33 ns minimum pulse width of the 10BASE-T Ethernet standard.

The outputs of the two sample data counters 16 and 18 are provided as the inputs to each of three logic gates: OR gate 20, AND gate 22, and AND gate 24.

The output of OR gate 20 drives a first maximum pulse width sample data counter 26. The output of AND gate 22 drives a second maximum pulse width sample data counter 28. Each of counters 26 and 28 are also conventional sample data counters that are driven by a 20 MHz clock (50 ns period).

The output of AND gate 24 sets latch 30 which, in turn, sets latch 40 via a multiplexor 32 that includes AND gates 34 and 36 and OR gate 38. The data output of latch 40 sets output latch 42, which controls data reception.

The circuit 10 is reset by the output of OR gate 46 which is driven by the outputs of maximum pulse width sample data counters 26 and 28 and by the output of latch 42.

Maximum pulse width sample data counter 26 is reset by the output of AND gate 22.

Maximum pulse width sample data counter 28 is reset by the output of latch 42.

The operation of sample data receiver squelch circuit 10 will now be described.

Since both sample data counter 16 and sample data counter 18 are driven by a 40 MHz clock and set to go active high when enabled for two counts, whenever counter 16 receives a positive output pulse PPULSE or a negative output pulse NPULSE having a pulse width greater than 33 ns, it causes the output of the respective counter 16 or counter 18 to go active high after two 25 ns cycles. Thus, together, counters 16 and 18 form a low-pass filter having a 15 MHz cut-off point.

When the output of either counter 16 or counter 18 is high, it drives the output of OR gate 20 high, starting maximum pulse width sample data counter 26, which is driver by a 20 MHz clock (50 ns period), to determine whether the pulse width of the received pulse is less than 200 ns. When a second pulse of greater than 33 ns is received, which must be of opposite polarity from the first pulse, AND gate 22 starts the second maximum pulse width sample data counter 28, which is driven by 20 MHz clock (50 ns period), to determine whether the pulse width of the second pulse is less than 200 ns. Thus, together, counter 26 and counter 28 form a high pass filter having a cut-off frequency greater than 2.5 MHz.

In the embodiment of the invention shown in FIG. 1, detection of the second received pulse resets counter 26 (via the output of AND gate 22) and initiates counter 28. Detection of the third pulse, which must be of opposite polarity to that of the second pulse, resets counter 28. (Those skilled in the art will appreciate that a number of timing mechanisms could be used to achieve the desired result. For example, the period of the input signal could be used to reset counters 26 and 28. Utilizing this approach, detection of the first pulse starts counter 26. Detection of the second pulse starts counter 28; counter 26 continues to run. Detection of the third pulse, which must be of opposite polarity to that of the second pulse, and, thus, indicative of the occurrence of a full signal cycle, stops both counter 28 and timer 26, as indicated by dashed line 29 in FIG. 1.)

As further shown in FIG. 1, AND gate 24 detects the first arriving positive pulse and responds by setting latch 30. If a negative pulse arrives first, then latch 30 remains in the reset state. Together, AND gate 24 and latch 30 "remember" the polarity of the first pulse so that only a third pulse having the same polarity as the first pulse passes through the 2:1 multiplexor 32 formed by AND gates 34 and 36 and OR gate 38 to set latch 40.

Latch 40 is always in the reset state unless at least two pulses (i.e. one full cycle) are detected. As explained above, latch 40 is set by the third pulse.

The output of latch 40 sets output latch 42, which generates a RECEIVE-DATA output signal which enables data reception.

Latch 42 is reset when a fifth sample data counter 44, which is driven by a 20 MHz clock (50 ns period), identifies an End-of-Packet pulse, in FIG. 1, a positive pulse PPULSE>250 ns, thereby terminating data reception.

The output Q of latch 42 resets counters 16, 18 and 28.

It should be understood that various alternatives to the embodiment of the invention described herein may be employed in practicing the invention. It is intended that the following claims define the scope of the invention and that apparatus and methods within the scope of these claims and their equivalents be covered thereby.

What is claimed is:

1. A sample-data receiver squelch circuit for filtering an incoming data signal that includes first and second differential inputs, the receiver squelch circuit comprising:

a comparator that responds to the differential inputs by generating a positive pulse when the difference in signal level between the differential inputs exceeds a preselected positive threshold level and by generating a negative pulse when the difference in signal level is less than a preselected negative threshold level;

a first sample data counter connected to receive positive pulses from the comparator and that generates a first counter active output signal when a positive pulse has a pulse width greater than a preselected minimum pulse width;

a second sample data counter connected to receive negative pulses from the comparator and that generates a second counter active output signal when a negative pulse has a pulse width greater than the preselected minimum pulse width;

a first maximum pulse width sample data counter connected to receive the outputs of the first and second sample data counters for generating a first active long pulse output signal when a first received pulse, which may be either a first counter or a second counter active output signal, has a pulse width less than a preselected maximum pulse width;

a second maximum pulse width sample data counter connected to receive the outputs of the first and second sample data counters for generating a second active long pulse output signal when a second received pulse, received subsequent to and of opposite polarity with respect to the first received pulse, has a pulse width less than the preselected maximum pulse width;

receive data trigger means responsive to the first received pulse and to a third received pulse of the same polarity as the first received pulse for generating a receive data output signal; and a reset sample data counter responsive to a positive pulse having a pulse width greater than a preselected maximum termination pulse width for generating a reset signal that cancels the receive data output signal.

2. A sample data receiver squelch circuit as in claim 1 and utilizable in a 10BASE-T Ethernet receiver and wherein the preselected minimum pulse width is 33.33 ns, the preselected maximum pulse width is 200 ns, and the preselected maximum termination pulse width is 250 ns.

3. A method of filtering incoming differential inputs, the method comprising:

comparing the signal levels of the differential inputs;

providing a positive pulse when the difference in the signal level between the differential inputs exceeds a preselected positive threshold level;

providing a negative pulse when the difference in the signal level between the differential inputs is less than a preselected negative threshold level;

utilizing a first sample data counter to generate a first counter active output signal when a positive pulse has a pulse width greater than a preselected minimum pulse width;

utilizing a second sample data counter to generate a second counter active output signal when a negative pulse has a pulse width greater than the preselected minimum pulse width;

utilizing a third sample data counter to generate a first active long pulse output signal when a first received pulse, which may be either a first counter or a second counter active output signal, has a pulse width less than a preselected maximum pulse width;

utilizing a fourth sample data counter to generate a second active long pulse output signal when a second received pulse, received subsequent to and of opposite polarity with respect to the first received pulse, has a pulse width less than the preselected maximum pulse width;

generating a receive data output signal in response to the generation of the first received pulse and a third received pulse of the same polarity as the first received pulse;

utilizing a fifth sample data counter to generate an End-of-Packet pulse having a pulse width greater than a preselected maximum termination pulse width; and upon identification of the End-of-Packet pulse, cancelling the receive data output signal.

4. A method as in claim 3 wherein the method is utilizable in conjunction with a 10BASE-T Ethernet receiver and wherein the preselected minimum pulse width is 33.33 ns, the preselected maximum pulse width is 200 ns, and the preselected maximum termination pulse width is 250 ns.

5. A sample-data receiver squelch circuit for filtering an incoming data signal that includes first and second differential inputs, the receiver squelch circuit comprising:

a comparator that responds to the differential inputs be generating a pulse having a first polarity when the difference in signal level between the differential inputs exceeds a preselected positive threshold level and by generating a pulse having a second polarity opposite to the first polarity when the difference in signal level is less than a preselected negative threshold level;

a first sample data counter connected to receive pulses having the first polarity from the comparator and that generates a first counter active output signal when a received pulse having the first polarity has a pulse width greater than a preselected minimum pulse width;

a second sample data counter connected to receive pulses having the second polarity from the comparator and that generates a second counter active output signal when a received pulse having the second polarity has a pulse width greater than the preselected minimum pulse width;

a first maximum pulse width sample data counter connected to receive outputs at the first and second sample data counters for generating a first active long pulse output signal when a first received pulse, which may be either a first counter or a second counter active output signal, has a pulse width less than a preselected maximum pulse width;

a second maximum pulse width sample data counter connected to receive the outputs of the first and second sample data counters for generating a second active long pulse output signal when a second received pulse, received subsequent to and of opposite polarity with respect to the first received pulse, has a pulse width less than the preselected maximum pulse width;

a receive data trigger responsive to the first received pulse and to a third received pulse of the same polarity as the first received pulse for generating a receive data output signal; and a reset sample data counter responsive to a pulse having the first polarity and having a pulse width greater than a preselected maximum termination pulse width for generating a reset signal that cancels the receive data output signal.

* * * * *